(12) United States Patent
Jung et al.

(10) Patent No.: US 10,218,064 B2
(45) Date of Patent: Feb. 26, 2019

(54) COMPOSITE SUBSTRATE FOR ANTENNA MODULE AND PREPARATION METHOD THEREOF

(71) Applicant: DOOSAN CORPORATION, Seoul (KR)

(72) Inventors: Yoon Ho Jung, Yongin-si (KR); Hyung Min Cho, Yongin-si (KR); Hyo Seung Jin, Yongin-si (KR); Eun Song Baik, Yongin-si (KR); Tae Geuk Lim, Yongin-si (KR)

(73) Assignee: DOOSAN CORPORATION, Seoul (KR)

( * ) Notice: Subject to any disclaimer, the term of this patent is extended or adjusted under 35 U.S.C. 154(b) by 158 days.

(21) Appl. No.: 15/305,413

(22) PCT Filed: Aug. 30, 2016

(86) PCT No.: PCT/KR2016/009611
§ 371 (c)(1),
(2) Date: Oct. 20, 2016

(87) PCT Pub. No.: WO2018/012668
PCT Pub. Date: Jan. 18, 2018

(65) Prior Publication Data
US 2018/0205142 A1 Jul. 19, 2018

(30) Foreign Application Priority Data
Jul. 11, 2016 (KR) ........................ 10-2016-0087310

(51) Int. Cl.
*H01Q 7/06* (2006.01)
*H01Q 1/38* (2006.01)
(Continued)

(52) U.S. Cl.
CPC ............... *H01Q 1/38* (2013.01); *H01F 10/08* (2013.01); *H01F 10/12* (2013.01); *H05K 1/0373* (2013.01);
(Continued)

(58) Field of Classification Search
CPC .. H01Q 1/38; H01Q 1/48; H01Q 7/06; H05K 1/09; H05K 1/028; H05K 1/0326; H05K 3/02; H05K 3/06; H05K 9/00
See application file for complete search history.

(56) References Cited

U.S. PATENT DOCUMENTS

2015/0102892 A1* 4/2015 Yeo ..................... H01F 1/14716
336/200
2015/0189760 A1* 7/2015 Ho ........................... G03F 7/20
174/251
(Continued)

FOREIGN PATENT DOCUMENTS

| JP | 2001156487 A | 6/2001 |
|---|---|---|
| JP | 2004082687 A | 3/2004 |

(Continued)

OTHER PUBLICATIONS

Korean Intellectual Property Office communication dated Oct. 19, 2017 in counterpart application No. 10-2017-0106748.
(Continued)

*Primary Examiner* — Hoang V Nguyen
(74) *Attorney, Agent, or Firm* — Sughrue Mion, PLLC

(57) ABSTRACT

The present disclosure provides a composite substrate for an antenna module, which includes: a first non-magnetic substrate that is configured to have a first copper foil; a second non-magnetic substrate that is configured to have a second copper foil; and a magnetic sheet that is configured to be interposed between the first non-magnetic substrate and the second non-magnetic substrate and that is configured to be
(Continued)

integrally laminated with the non-magnetic substrates, and further provides a preparation method thereof. The present disclosure provides a simplification of a process, low costs, a slim design, and a grip-feeling of a metal material while providing functions of wireless charging, MST, and NFC.

16 Claims, 3 Drawing Sheets

(51) Int. Cl.
  *H05K 1/09* (2006.01)
  *H05K 3/46* (2006.01)
  *H05K 1/03* (2006.01)
  *H01F 10/12* (2006.01)
  *H01F 10/08* (2006.01)
  *H05K 3/02* (2006.01)
  *H05K 9/00* (2006.01)
  *H04B 5/00* (2006.01)

(52) U.S. Cl.
  CPC ............. *H05K 1/09* (2013.01); *H05K 3/02* (2013.01); *H05K 3/4644* (2013.01); *H05K 9/00* (2013.01); *H04B 5/0087* (2013.01); *H05K 2201/10098* (2013.01)

(56) References Cited

U.S. PATENT DOCUMENTS

| | | | |
|---|---|---|---|
| 2016/0099498 A1* | 4/2016 | Pance | .............. H01F 1/0551 343/787 |
| 2016/0152008 A1* | 6/2016 | Ogata | .............. B29C 39/14 428/337 |

FOREIGN PATENT DOCUMENTS

| | | | |
|---|---|---|---|
| JP | 2005262506 A | | 9/2005 |
| JP | 2007094563 A | | 4/2007 |
| JP | 2009027145 A | | 2/2009 |
| KR | 10-2013-0078110 A | | 7/2013 |
| KR | 10-1563302 B1 | | 10/2015 |
| KR | 10-2015-0137905 A | | 12/2015 |
| KR | 10-2016-0043293 A | | 4/2016 |
| KR | 5913773 B2 | | 4/2016 |
| KR | 10-1627090 B1 | | 6/2016 |

OTHER PUBLICATIONS

International Searching Authority International Search Report dated Mar. 17, 2017 in counterpart International Application No. PCT/KR2016/009611.

Japan Patent Office, Communication dated Nov. 30, 2018, issued in counterpart Japanese application No. 2016-563961.

* cited by examiner

COMPOSITE SUBSTRATE FOR ANTENNA MODULE AND PREPARATION METHOD THEREOF

TECHNICAL FIELD

The present disclosure relates to a composite substrate for an antenna module, which is able to ensure a reduction in the cost and the simplification of a process while providing a function of wireless charging (WPC), MST, or NFC, and further relates to a preparation method thereof.

BACKGROUND

Terminals may be divided into mobile/portable terminals and stationary terminals depending on whether or not they are able to move. In addition, the mobile terminals may be divided into handheld terminals and vehicle mounted terminals according to whether or not the user can directly carry the terminals.

Handheld terminals (such as, mobile phones, PDAs, PMPs, navigation systems, or laptop computers) provide the functions of DMB, the wireless internet, and near-field communication between devices, as well as the basic functions of phone-calls, video/music playback, navigation, and the like. According to this, the mobile terminals adopt a plurality of antennas for wireless communication (such as the wireless Internet or Bluetooth), and there is a tendency to apply, to the handheld terminals, functions of exchanging information between the terminals by using near-field communication (NFC), payment, ticket reservation, or searching. To this end, the handheld terminals have one or more antenna modules for handheld terminals, which are used for the wireless communication and the near-field communication.

In general, since the back cover of the mobile terminal is made of an insulating material of polycarbonate, it does not affect the communication of the antenna module that is mounted in the battery pack or in the back cover. However, the demand for the production of a metal cover has been increasing by reflecting a recent trend (for example, a grip-feeling or a design trend, such as appearance) that is preferred by consumers. In this case, the above-described antenna signal is blocked by a metal material in order to thereby disable the wireless communication and the near-field wireless communication. In addition, the antenna module that is mounted inside the terminal is too thick and a preparation process thereof is complicated.

SUMMARY

The present disclosure has been made to solve the above-described problems, the disclosure of which provides a composite substrate for an antenna module that enables the simplification of a process, low costs, and slimness of a device caused by a reduction in the thickness while providing a plurality of antenna functions (such as wireless charging (WPC), MST, or NFC), and which further provides a preparation method thereof.

The present disclosure provides a composite substrate for an antenna module, which includes: a first non-magnetic substrate that is configured to have a first copper foil; a second non-magnetic substrate that is configured to have a second copper foil; and a magnetic sheet that is configured to be interposed between the first non-magnetic substrate and the second non-magnetic substrate and that is configured to be integrally laminated with the first and second non-magnetic substrates.

In the present disclosure, preferably, the magnetic sheet and the first and second non-magnetic substrates, which are disposed on the upper and lower surfaces thereof, are integrated through a roll-to-roll process so that the composite substrate may be in the form of a roll that extends in the longitudinal direction.

In the present disclosure, the magnetic sheet includes a magnetic powder and a polymer resin.

In the present disclosure, the magnetic powder may be selected from the group consisting of a metal powder, a metal flake, and ferrite, all of which have magnetism.

In the present disclosure, the polymer resin may be selected from the group consisting of non-halogen-based epoxy resin, silicone, urethane, polyimide, and polyamide.

In the present disclosure, the magnetic sheet may include a magnetic powder of 70 to 95 wt % based on the total weight of the magnetic sheet, and the magnetic permeability thereof may be in the range of 50 to 250.

In the present disclosure, the first non-magnetic substrate and the second non-magnetic substrate may further include a first insulating adhesion layer and a second insulating adhesion layer, respectively.

In the present disclosure, the composite substrate may include: (i) the first copper foil, the first insulating adhesion layer, the magnetic sheet, the second insulating adhesion layer, and the second copper foil; (ii) the first copper foil, the first insulating adhesion layer, the magnetic sheet, and the second copper foil; (iii) the first copper foil, the magnetic sheet, the second insulating adhesion layer, and the second copper foil; or (iv) the first copper foil, the magnetic sheet, and the second copper foil, all of which are laminated in sequence.

In the present disclosure, the first and second non-magnetic substrates may be flexible copper clad laminates (FCCL) or flexible printed circuit boards (FPCB), respectively.

In the present disclosure, the first and second insulating adhesion layers may be formed of polymer resin selected from the group consisting of polyimide and epoxy resin, and may further include one or more selected from the group consisting of thermoplastic resin, inorganic fillers, and curing agents, respectively.

In the present disclosure, the peel strength of the first insulating adhesion layer or the second insulating adhesion layer with respect to the magnetic sheet in the composite substrate may be 0.6 to 3.0 kgf/cm$^2$, and the magnetic permeability thereof may be in the range of 50 to 250.

In the present disclosure, the thickness of the magnetic sheet may be in the range of 20 to 150 μm after the process, and the thicknesses of the first copper foil and the second copper foil may be in the range of 6 to 105 μm, respectively. The thicknesses of the first insulating adhesion layer and the second insulating adhesion layer may be in the range of 1 to 30 μm, respectively.

In the present disclosure, the total thickness of the composite substrate may be in the range of 34 to 420 μm.

In the present disclosure, the first copper foil and the second copper foil may form a first antenna pattern portion and a second antenna pattern portion, respectively, which have a predetermined area, line width, and/or shape.

In the present disclosure, the composite substrate may have one or more through-holes that pass through the first non-magnetic substrate, the magnetic sheet, and the second non-magnetic substrate, and the first antenna pattern portion and the second antenna pattern portion are electrically connected to each other through the through-holes.

In the present disclosure, the composite substrate may further include at least one of a wireless power consortium (WPC) antenna pattern, a magnetic secure transmission (MST) antenna pattern, and a near-field communication (NFC) antenna pattern, and preferably, may be a combo type that includes two or more antenna module patterns thereof.

The present disclosure configures an integral composite substrate that is made by laminating non-magnetic substrates (for example, FCCL) and a magnetic sheet in order to thereby reduce the cost and in order to thereby simplify a preparation process because a separate ferrite sheet is not required.

In addition, with the implementation of an integral structure of the magnetic sheet and the non-magnetic substrates, the total thickness of the antenna module may decrease in order to thereby enable the slimness of a device and the simplification of a process.

Furthermore, since the roll type of composite substrate can be prepared through a typical roll-to-roll process, the effect of the cost reduction can be further improved through the simplification of a preparation process.

BRIEF DESCRIPTION OF THE DRAWINGS

The above and other objects, features, and advantages of the present disclosure will be more apparent from the following detailed description taken in conjunction with the accompanying drawings, in which.

Figure 1:
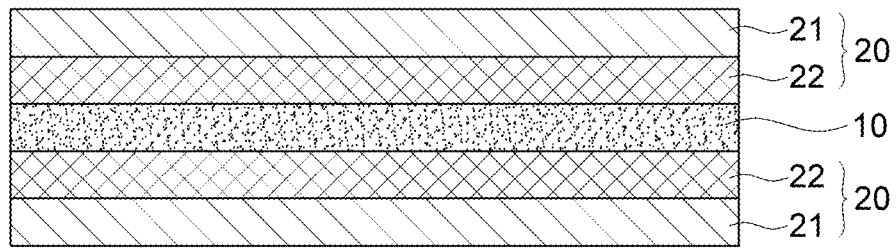
FIGS. 1 to 4 schematically illustrate a cross-sectional structure of a composite substrate for an antenna module, according to an embodiment of the present disclosure.

EXPLANATION OF REFERENCE NUMERALS AND SYMBOLS 100, 200, 300, 400: composite substrate for an antenna module
10: a magnetic sheet
20: a first non-magnetic substrate, a second non-magnetic substrate
21: a first copper foil, a second copper foil
22: a first insulating adhesion layer, a second insulating adhesion layer

DETAILED DESCRIPTION

Hereinafter, preferred embodiments of the present disclosure will be described. However, the embodiments of the present disclosure may be modified in various forms, and the scope of the present disclosure is not limited to the embodiments, which will be described below. In addition, the embodiments of the present disclosure are provided in order to more completely explain the present disclosure to those skilled in the art.

In addition, throughout the specification, the meaning that one part is "connected" with another part includes the case where a part is "indirectly connected" with another part while other elements are interposed therebetween, as well as the case where a part is "directly connected" with another part. In addition, the case where a certain component is "included" means that other components can be further included instead of excluding other components unless otherwise stated.

The current materials for shielding electromagnetic waves may include (1) a single material, such as soft magnetic alloys or soft magnetic ferrite sintered materials, or (2) a composite material that is formed by mixing a soft magnetic metal powder or a soft magnetic ferrite powder with ceramic or a synthetic resin.

Here, the core of the electromagnetic wave shielding material is to maintain the appropriate magnetic permeability and magnetic loss factor. The magnetic permeability refers to the amount of frequency signals that can pass, which are generated in communication, and the magnetic loss factor refers to the amount of frequencies that cannot pass through a shielding material. That is, the magnetic permeability is inversely proportional to the magnetic loss factor. At this time, it is important to properly maintain the two properties mentioned above. For example, if the magnetic permeability is too high, undesired noise signals may be transferred in order to thereby cause the interference of the electromagnetic waves, whereas if the magnetic permeability is too low, necessary signals cannot be transferred so that the characteristics of the magnetic permeability and magnetic loss factor for each frequency band are different depending on the electromagnetic shielding materials. Therefore, a suitable material should be used according to the frequency band to be used.

In general, the wireless charging uses a frequency of 100 to 357 KHz in the magnetic induction, and the NFC communication uses a frequency of 13.56 MHz. Until now, a Ni—Zn ferrite material has been used as a shielding material that fully meets the conditions above because it has a good performance in the wireless charging (WPC) and the NFC communication and is easy to be prepared with a competitive price. In addition, soft magnetic metal-resin composite materials or alternative materials (such as a Mn—Zn ferrite sheet) have been steadily developed.

Meanwhile, since the conventional ferrite sheets or composite materials are thick and have a complicated preparation process, they cannot meet the trend of the slimness of mobile devices and the simplification of a preparation process.

Thus, the present disclosure provides a double-sided composite substrate of a new structure that can provide complex functions of wireless charging, NFC, MST, and antennas by using a composite substrate that is prepared through a single process.

More specifically, the present disclosure configures an integral composite substrate that is laminated with a non-magnetic substrate (for example, FCCL) and a magnetic sheet {polymeric magnet sheet (PMS)}. Accordingly, a separate ferrite sheet is not required to be used, and with the implementation of an integral structure of the magnetic sheet and the non-magnetic substrate, the total thickness of the antenna module can decrease in order to thereby enable the slimness of a device and the simplification of a process.

Furthermore, since the roll type of composite substrate can be prepared through a typical roll-to-roll process, the effect of the cost reduction can be further improved through the simplification of a preparation process.

Furthermore, a mass production equipment cost of the soft magnetic metal-resin-based composite material, according to the present disclosure, is less than the conventional Ni—Zn ferrite sheet, and the soft magnetic metal-resin-based composite material can be prepared by a roll-to-roll process. In addition, the soft magnetic metal-resin-based composite material, according to the present disclosure, enables the reduction in the thickness through embedded coils and enables a lamination structure design. Therefore, once a mass production technology is obtained, the soft magnetic metal-resin-based composite material can secure an excellent cost competitiveness compared to the conventional ferrite sheet. Accordingly, the present disclosure may provide a new composite material that can be used for a shielding material of a wireless charging reception module by replacing the conventional ferrite sheet.

<Composite Substrate for Antenna Module>

Hereinafter, a composite substrate for an antenna module, according to an embodiment of the present disclosure, will be described with reference to the accompanying drawings.

The antenna module, according to the present disclosure, includes a magnetic sheet and two non-magnetic substrates. Here, the non-magnetic substrates may include a copper foil, or may include a copper foil and an insulating adhesion layer, respectively.

FIG. 1 schematically illustrates a cross-sectional structure of a composite substrate 100 for an antenna module, according to an embodiment of the present disclosure, wherein two non-magnetic substrates 20 that are made by laminating a copper foil 21 and an insulating adhesion layer 22 are disposed on the upper and lower surfaces of a magnetic sheet 10, respectively, in order to thereby make an integrally laminated structure.

More specifically, the composite substrate 100 for an antenna module includes a first copper foil 21, a first insulating adhesion layer 22, a magnetic sheet 10, a second insulating adhesion layer 22, and a second copper foil 21, all of which are laminated in sequence.

The composite substrate 100 for an antenna module may be preferably shaped into a roll that extends in the longitudinal direction by integrating: the magnetic sheet 10; and the first non-magnetic substrate 20 and the second non-magnetic substrate 20 that are disposed on the upper and lower surfaces of the magnetic sheet 10, respectively. However, the composite substrate 100 for an antenna module is not specifically limited thereto.

Here, release films may be further laminated on the first copper foil 21 and the second copper foil 21, respectively.

<Magnetic Sheet>

In the composite substrate for an antenna module of the present disclosure, the magnetic sheet 10 includes a magnetic material to play the role of blocking electromagnetic waves while providing the adhesion, the heat resistance, and the interlayer adhesion.

The magnetic sheet 10 may be in the form of an insulating layer, a film, or a sheet, and may be made of a polymeric magnet sheet (PMS) that is configured to include a typical magnetic powder and polymer resin, which are known in the art.

The magnetic powder is not specifically limited, and any powders that exhibit magnetism may be used for the magnetic powder. For example, the magnetic powder may be a metal powder, a metal flake, ferrite, or a mixture thereof, which has magnetism. Preferably, the magnetic powder may be a ferrite powder. At this time, the size, the form, or the content of the magnetic powder may not be specifically limited, and may be appropriately adjusted within a normal range that is known in the art.

In addition, the polymer resin forming the magnetic sheet 10 may adopt typical polymers without limitations, which are known in the art. For example, the polymer resin may be epoxy resin, and preferably, may be non-halogen-based epoxy resin that does not contain halogen elements, such as bromine (Br), in molecules.

The polymer resin is not limited to the epoxy resin, and, for example, may further contain silicon, urethane, polyimide, polyamide, or the like.

In the magnetic sheet 10 of the present disclosure, the magnetic powder-to-polymer resin content ratio is not specifically limited, and, for example, may be in the range of 50 to 95:5 to 50, preferably, 70 to 90:10 to 30, in a weight ratio.

In addition, the thickness of the magnetic sheet 10 is not specifically limited, and may be in the range of: 20 to 150 μm; preferably, 30 to 80 μm; or more preferably, 30 to 60 μm.

According to a preferred example of the present disclosure, the magnetic sheet may contain a magnetic powder of 70 to 95 wt % based on the total weight of the magnetic sheet. In addition, the magnetic permeability ($\mu'$) of the magnetic sheet may be 50 to 250, and the magnetic loss factor ($\mu''$) thereof may be less than 50. At this time, the magnetic permeability and the magnetic loss factor are measured at a frequency of 1 MHz to 100 MHz, or preferably, at a frequency of 3 MHz to 13.56 MHz.

The magnetic sheet 10 may be prepared by a typical method that is known in the art, and, for example, may be prepared by: forming a composition for a magnetic sheet, which contains a magnetic powder, solvent, and a polymer resin; molding the composition into a thin sheet; and heating the same. In addition, the aforementioned composition may be: directly coated on a non-magnetic substrate, such as the FCCL or the FPCB; laminated through roll lamination; and then cured in order to thereby make an integral composite substrate.

<Non-Magnetic Substrate>

In the composite substrate 100 for an antenna module of the present disclosure, the first non-magnetic substrate and the second non-magnetic substrate 20 may be formed of copper foils, or may be formed of substrates, resin-coated copper foils, copper foils, or sheets, which are known in the art and are made of laminating an insulating adhesion layer and a copper foil.

The first non-magnetic substrate 20 and the second non-magnetic substrate 20 may be the same or different from each other, and preferably, may be made by using a flexible copper clad laminate (FCCL) or a flexible printed circuit board (FPCB).

For example, the first non-magnetic substrate 20 that is disposed on one surface of the magnetic substrate 10 includes the first insulating adhesion layer 22 and the first copper foil 21, and the second non-magnetic substrate 20 that is disposed on the other surface of the magnetic substrate 10 includes the second insulating adhesion layer 22 and the second copper foil 21.

Here, the first copper foil 21 and the second copper foil 21 play the role of forming the first antenna pattern portion and the second antenna pattern portion, respectively, through the conventional dry or wet etching process that is known in the art. At this time, the first antenna pattern portion and the second antenna pattern portion may be formed to be the same, or different, in the area, the line width, or the shape thereof according to the usage of the antenna module to be applied.

In the present disclosure, the thicknesses of the first copper foil 21 and the second copper foil 21 may be the same or different from each other, and are not specifically limited. For example, the thicknesses of the first copper foil 21 and the second copper foil 21 may be in the range of 6 to 105 μm, or preferably, in the range of 12 to 50 μm, respectively.

In addition, the first insulating adhesion layer 22 and the second insulating adhesion layer 22 play the role of insulating the first copper foil 21 and the second copper foil 21 from the outside while strengthening a physical connection of the first and second non-magnetic substrates 20 and other members (for example, the magnetic sheet 10), which come in physical contact with the same, and the adhesion thereof.

The first insulating adhesion layer 22 and the second insulating adhesion layer 22 may be in the form of a coating layer or a film, and may be formed of typical polymer resins that are known in the art. At this time, the polymer composition of the first insulating adhesion layer 22 and the second insulating adhesion layer 22 may be the same or different from each other.

In the present disclosure, the first insulating adhesion layer 22 and the second insulating adhesion layer 22 may be formed of typical polyimide-based resins, epoxy resins, or a mixture thereof, which are known in the art. In addition, the first insulating adhesion layer 22 and the second insulating adhesion layer 22 may be formed by further including other thermosetting resins that are not described above, or including thermoplastic resins, inorganic fillers, or curing agents, which are common in the art.

The polyimide (PI) resin is a high molecular substance that has an imide ring, and the polyimide resin exhibits a low thermal expansion, low air permeability, and excellent electrical characteristics, as well as an excellent flame retardancy, heat resistance, flexibility, chemical resistance, wear resistance, and weather resistance, based on the chemical stability of the imide ring. Therefore, when the polyimide resin is used for the first insulating adhesion layer 22 and the second insulating adhesion layer 22, sufficient flame retardancy may be secured due to the flame retardancy of the polyimide. In addition, the scratch resistance may be improved because of an increase in the surface hardness. Furthermore, it is possible to secure an increase in the heat resistance caused by a high glass transition temperature and a high flexibility compared to the epoxy resin.

Thermosetting polyimide, which is known in the art, or soluble PI or polyamic acid compositions that are commercially available may be used as the polyimide (PI). For example, available polyimide-based resins may include polyimide, polyamide, polyamideimide, polyamic acid resin, or composite resins thereof, but may not be limited thereto.

In the case where the soluble polyimide or the polyamic acid composition is used in the present disclosure, typical thermosetting resins that are known in the art may be used. For example, available thermosetting resins may be one or more selected from the group consisting of epoxy resin, polyurethane resin, phenol resin, vegetable oil-modified phenol resin, xylene resin, guanamine resin, diallylphthalate resin, vinyl ester resin, unsaturated polyester resin, furan resin, polyimide resin, cyanate resin, maleimide resin, and benzocyclobutene resin, but may not be limited thereto. Preferably, the thermosetting resin may be epoxy resin, phenol resin, or vegetable oil-modified phenol resin. Among them, the epoxy resin is preferable because its reactivity and heat resistance are excellent.

Typical epoxy resins that are known in the art may be used without limitations, and it is preferable to use epoxy resins that do not include halogen elements in a single molecule and have two or more epoxy groups. Available epoxy resin, for example, may be bisphenol A/F/S resin, novolac epoxy resin, alkyl phenol novolac epoxy resin, biphenyl epoxy resin, aralkyl epoxy resin, naphthol epoxy resin, dicyclopentadiene epoxy resin, or a mixture thereof, but may not be limited thereto.

More specifically, the epoxy resin, for example, may be bisphenol A epoxy resin, bisphenol F epoxy resin, bisphenol S epoxy resin, naphthalene epoxy resin, anthracene epoxy resin, biphenyl epoxy resin, tetramethyl biphenyl epoxy resin, phenol novolac epoxy resin, cresol novolac epoxy resin, bisphenol A novolac epoxy resin, bisphenol S novolac epoxy resin, biphenyl novolac epoxy resin, naphthol novolac epoxy resin, naphthol phenol cocondensation novolac epoxy resin, naphthol cresol cocondensation novolac epoxy resin, aromatic hydrocarbon formaldehyde resin-modified phenolic epoxy resin, triphenylmethane epoxy resin, tetraphenyl ethane epoxy resin, dicyclopentadiene phenol addition reaction epoxy resin, phenol aralkyl epoxy resin, multi-functional phenol resin, naphthol aralkyl epoxy resin, or the like. At this time, a single epoxy resin described above may be used, or a mixture of two or more epoxy resins may be used.

A non-halogen-based adhesive composition, according to the present disclosure, may obtain effects of improving adhesiveness and flexibility and of relieving the thermal stress by containing thermoplastic resin.

Available thermoplastic resin, for example, may be acrylonitrile-butadiene copolymer (NBR), acrylonitrile-butadiene rubber-styrene resin (ABS), poly polybutadiene, styrene-butadiene-ethylene resin (SEBS), acrylic acid having a side chain of 1 to 8 carbon atoms and/or methacrylic acid ester resin (acrylic rubber), polyvinyl butyral, polyamide, polyester, polyimide, polyamideimide, polyurethane, or a mixture thereof, but may not be limited thereto.

It is preferable that the thermoplastic resin contains a functional group that is able to react with the epoxy resin. More specifically, one or more functional groups may be selected from the group consisting of an amino group, a carboxyl group, an epoxy group, a hydroxyl group, a methoxy group, and an isocyanate group. These functional groups form a strong bond with the epoxy resin in order to thereby improve the heat resistance after curing.

In particular, it is preferable to use acrylonitrile-butadiene copolymer (NBR) in consideration of the adhesiveness, the flexibility, and a mitigation effect of the thermal stress in the present disclosure. The copolymer preferably contains a functional group that is able to react with the epoxy resin. As a specific example, the functional group may include an amino group, a carboxyl group, an epoxy group, a hydroxyl group, a methoxy group, an isocyanate group, a vinyl group, or a silanol group, and preferably, may include a carboxyl group. As a specific example, the NBR having a carboxyl group may include PNR-1H (produced by JSR Corporation), and Nipol 1072J and Nipol DN631 (produced by Japan Zeon Corporation).

In the present disclosure, the thermoplastic resin content is not specifically limited, and, for example, may be in the range of 1 to 35 wt %, and preferably, 5 to 30 wt %, based on the total weight of the insulating adhesive composition. If the thermoplastic resin content is out of the range above, a sufficient adhesion may not be obtained and the heat resistance may be lowered.

Typical curing agents that are known in the art may be used without limitations in the present disclosure, and the curing agent may be properly selected to then be used according to the type of epoxy resin to be used. For example, available curing agents may include phenol-based curing agents, anhydride-based curing agents, dicyanamide-based curing agents, or aromatic polyamine curing agents, but may not be limited thereto. For example, available curing agents may include phenol-based curing agents (such as phenol novolac, cresol novolac, bisphenol A novolac, naphthalene, or the like) or polyamine-based curing agents {such as meta-phenylenediamine, diaminodiphenylmethane (DDM), diaminodiphenylsulfone (DDS), or the like}, but may not be limited thereto. At this time, a single curing agent mentioned above or a mixture thereof may be used.

In the present disclosure, the curing agent content is not specifically limited, and, for example, may be in the range of 5 to 10 wt % with respect to the total weight (100 wt %) of the thermosetting resin composition.

The present disclosure may include typical inorganic fillers that are known in the art.

For example, available inorganic fillers may include silicates (such as natural silica, fused silica, amorphous silica, crystalline silica, or the like), boehmite, alumina, aluminum hydroxide [Al(OH)$_3$], talc, spherical glass, calcium carbonate, magnesium carbonate, magnesia, clay, calcium silicate, titanium oxide, antimony oxide, glass fiber, aluminum borate, barium titanate, strontium titanate, calcium titanate, magnesium titanate, bismuth titanate, titanium oxide, barium zirconate, calcium zirconate, boron nitride, silicon nitride, talc, mica, or the like, but may not be limited thereto. A single inorganic filler or a mixture thereof may be used.

In the present disclosure, the size of the inorganic filler is not specifically limited, and the average diameter thereof may be in the range of 0.5 to 10 μm. In addition, the inorganic filler content is not specifically limited, and may be in the range of 5 to 20 wt % with respect to the total weight (100 wt %) of the thermosetting resin composition.

In addition to the components above, the thermosetting resin composition of the present disclosure may further include flame retardants that are known in the art, other thermosetting resins or thermoplastic resins that are not described above and various polymers, such as oligomers thereof, or other additives (such as solid rubber particles, ultraviolet absorbers, antioxidants, polymerization initiators, dyes, pigments, dispersants, thickeners, leveling agent, or the like) as necessary unless it interferes with the unique properties of the resin composition.

As a preferable example of the present disclosure, the thermosetting adhesive composition that forms the first insulating adhesion layer 22 and the second insulating adhesion layer 22 may have an epoxy resin of 30 to 50 wt %, a thermoplastic resin of 5 to 30 wt %, a curing agent (additive) of 5 to 10 wt %, and an inorganic filler of 5 to 20 wt % based on the total weight (100 wt %) of the composition. Here, the epoxy resin may implement the chemical resistance and the flexibility, and the thermoplastic resin may provide the improvement of the adhesiveness and flexibility and a mitigation effect of the thermal stress. The thermosetting adhesive composition may comprise typical organic solvents that are known in the art, and the content of the organic solvents is not specifically limited. For example, it may be the balance organic solvent to satisfy a total of 100 parts by weight of the thermosetting adhesive composition.

The thermosetting adhesive composition made of the above-described components may be coated on the first copper foil (the second copper foil) to then be dried in order to thereby form the first insulating adhesion layer or the second insulating adhesion layer.

In the composite substrate for an antenna module of the present disclosure, the thicknesses of the first insulating adhesion layer 22 and the second insulating adhesion layer 22 may be properly adjusted in consideration of the handling of the substrate, the physical rigidity thereof, or the slimness of the substrate. The thicknesses of the first insulating adhesion layer 22 and the second insulating adhesion layer may be the same or different from each other, and, for example, may be in the range of 1 to 30 μm, or may be preferably in the range of 5 to 15 μm, respectively.

In the present disclosure, the peel strength of the first and second insulating adhesion layers 22 with respect to the magnetic sheet 10 may be 0.6 to 3.0 kgf/cm$^2$, and preferably, may be 1.0 to 2.0 kgf/cm$^2$. In addition, the magnetic permeability thereof may be 50 to 250, and preferably, may be 100 to 200.

The composite substrate 100 for an antenna module of the present disclosure may further include release films that are disposed on the first copper foil 21 and the second copper foil 21, which are the outermost layers.

The release film may be applied with a conventional configuration that is known in the art without limitations, and, for example, release films (such as plastic films) or release paper may be used for the same.

For example, available plastic films may be polyester films (such as polyethylene terephthalate (PET), polybutylene terephthalate, polyethylene naphthalate, or the like), polyethylene films, polypropylene films, cellophane, diacetylcellulose films, triacetylcellulose films, acetylcellulose butyrate films, polyvinyl chloride films, polyvinylidene chloride films, polyvinyl alcohol films, ethylene-vinyl acetate copolymer films, polystyrene films, polycarbonate films, polymethylpentene films, polysulfone films, polyetheretherketone films, polyethersulfone films, polyetherimide films, polyimide films, fluorine resin films, polyamide films, acrylic resin film, norbornene-based resin films, cycloolefin resin films, or the like. These plastic films may be transparent or semi-transparent, or may, or may not, be colored. The plastic film may be suitably selected according to the purpose.

Meanwhile, the composite substrate for an antenna module, according to the present disclosure, may have four embodiments as follows.

FIG. 1 schematically illustrate a cross-sectional structure of a composite substrate 100 for an antenna module, according to an embodiment of the present disclosure, wherein two non-magnetic substrates 20 that are made by laminating a copper foil 21 and an insulating adhesion layer 22 are disposed on the upper and lower surfaces of a magnetic sheet 10, respectively, in order to thereby make an integrally laminated structure.

Figure 2:
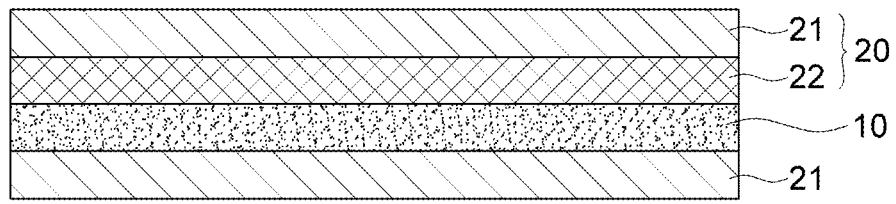

FIG. 2 schematically illustrate a cross-sectional structure of a composite substrate 200 for an antenna module, according to an embodiment of the present disclosure, wherein a first copper foil 21 and a first insulating adhesion layer 22 are laminated in sequence on one surface of a magnetic sheet 10, and a second copper foil 21 is laminated on the other surface of the magnetic sheet 10 in order to thereby make an integrally laminated structure.

Figure 3:
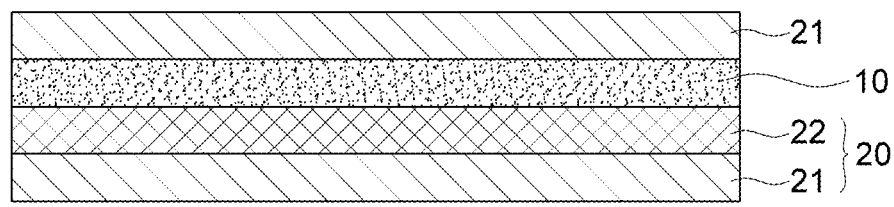

FIG. 3 schematically illustrate a cross-sectional structure of a composite substrate 300 for an antenna module, according to an embodiment of the present disclosure, wherein a first copper foil 21 is laminated on one surface of a magnetic sheet 10, and a second insulating adhesion layer 22 and a second copper foil 21 are laminated in sequence on the other surface of the magnetic sheet 10 in order to thereby make an integrally laminated structure.

Figure 4:
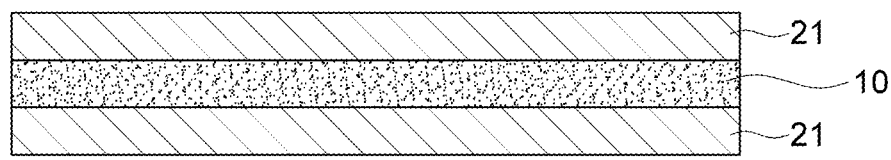
Figure 5:
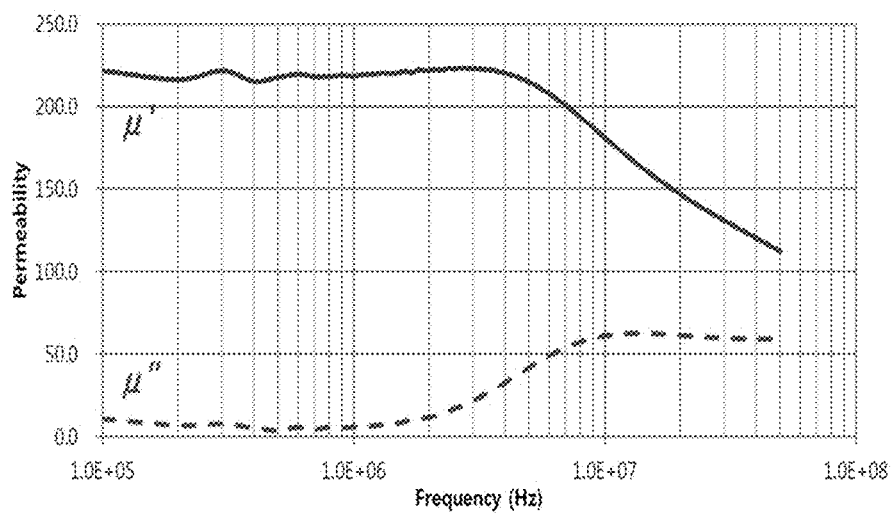
FIG. 5 is a graph for evaluating the magnetic permeability of a composite substrate for an antenna module that is prepared in Embodiment 1.
Figure 6:
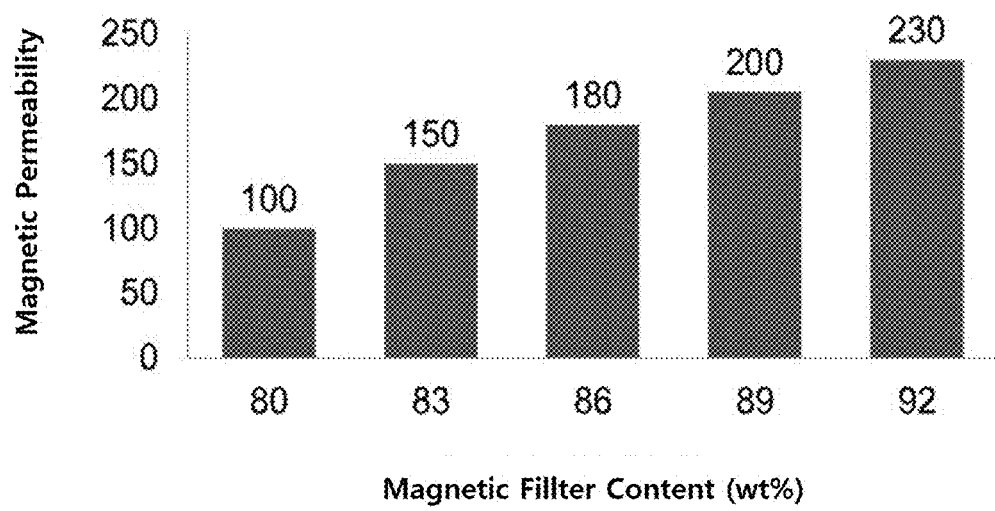
FIG. 6 is a graph showing a change in the magnetic permeability of the magnetic sheet depending on the magnetic powder content.

FIG. 4 schematically illustrate a cross-sectional structure of a composite substrate 400 for an antenna module, according to an embodiment of the present disclosure, wherein a first copper foil 21 and a second copper foil 21 are laminated on both surfaces of a magnetic sheet 10, respectively, in order to thereby make an integrally laminated structure.

Here, the configurations of the magnetic sheet 10, the first and second copper foils 21, and the first and second insulating adhesion layers 22 are the same as that of FIG. 1, so the description thereof will be omitted.

<Preparation Method of Composite Substrate for Antenna Module>

The composite substrate for an antenna module, according to the present disclosure, may be prepared by typical methods that are known in the art without limitations, and the preparation method may have two embodiments as follows.

More specifically, the first embodiment for preparing the composite substrate for an antenna module of the present disclosure may include: coating an adhesive composition that forms the insulating adhesion layer on the first copper foil (or the second copper foil); arranging the same to face a magnetic sheet and/or the second copper foil (or the first copper foil) as necessary; and laminating and curing the same by applying a continuous roll lamination process. The first embodiment may be implemented by five different methods.

The first preferable example of the methods may be configured to include: (i) coating a thermosetting composition for an insulating adhesion layer on one surface of the first copper foil and the second copper foil, respectively, to then be dried; and (ii) interposing a magnetic sheet between the insulating adhesion layer of the first copper foil and the insulating adhesion layer of the second copper foil and laminating the same by applying a roll lamination process.

In addition, the second preferable example of the methods may be configured to include: (i) coating a thermosetting composition for an insulating adhesion layer on one surface of the first copper foil and the second copper foil, respectively, to then be dried; (ii) coating a composition for a magnetic sheet on the insulating adhesion layer to then be dried; and (iii) arranging the coating layer for the magnetic sheet of the first copper foil and the coating layer for the magnetic sheet of the second copper foil to face each other and laminating and curing the same by applying a roll lamination process.

In addition, the third preferable example of the methods may be configured to include: (i) coating a thermosetting composition for an insulating adhesion layer on the first copper foil and laminating a magnetic sheet; and (ii) arranging the magnetic sheet of the first copper foil and the second copper foil to face each other and laminating and curing the same by applying a roll lamination process.

In addition, the fourth preferable example of the methods may be configured to include: (i) coating a thermosetting composition for an insulating adhesion layer on one surface of the first copper foil to then be dried; and (ii) disposing the insulating adhesion layer of the first copper foil, a magnetic sheet, and the second copper foil, and laminating and curing the same by applying a roll lamination process.

Furthermore, the fifth preferable example of the methods may be configured to include: (i) coating a thermosetting composition for an insulating adhesion layer on one surface of the first copper foil to then be dried; (ii) coating a thermosetting composition for a magnetic sheet on the insulating adhesion layer to then be dried; and (iii) arranging the magnetic sheet of the first copper foil and the second copper foil to face each other and laminating and curing the same by applying a roll lamination process.

In the first to fifth examples, the pressing process conditions may be appropriately adjusted within a common range that is known in the art. For example, a thermal compression laminating process (roll-to-roll process) may be performed at a temperature of 50 to 200° C., under a pressure of 3 to 200 kgf/cm$^2$, and at a press speed of 0.1 m/min to 20 m/min. However, the conditions are not limited thereto.

Here, the first copper foil, the second copper foil, and the magnetic sheet may be in the form of a sheet, and may be continuously laminated according to the roll-to-roll process described above to then be wound into a roll.

In addition, in the second embodiment for preparing the composite substrate for an antenna module of the present disclosure, the curing process may be performed by using a batch oven instead of the roll lamination process described above.

The sixth preferable example of the methods may be configured to include: (i) coating a thermosetting composition for an insulating adhesion layer on one surface of the first copper foil and then laminating a magnetic sheet; (ii) coating a thermosetting composition for an insulating adhesion layer on one surface of the second copper foil and then laminating the magnetic sheet of step (i); and (iii) curing the laminated product of step (ii) in a batch oven.

In the present disclosure, the conditions in the batch oven may be configured to have a temperature and time to fully cure the thermosetting composition for the adhesion layer, and may not be specifically limited.

The composite substrate for an antenna module of the present disclosure, which is configured as described above, may constitute an antenna module by using a typical method that is known in the art.

For example, the first copper foil and the second copper foil in the composite substrate may form the first antenna pattern portion and the second antenna pattern portion, respectively, which have a predetermined area, line width, and shape.

In addition, the composite substrate may have one or more through-holes that pass through the first non-magnetic substrate, the magnetic sheet, and the second non-magnetic substrate, and the first antenna pattern portion and the second antenna pattern portion may be connected to each other through the through-holes.

The composite substrate for an antenna module, according to the present disclosure, may be mounted in the mobile terminal, and may include at least of a WPC antenna pattern, an MST antenna pattern, or an NFC antenna pattern. Preferably, the composite substrate for an antenna module may be a combo type that includes two or more antenna patterns. For example, the composite substrate for an antenna module may be a combo type that includes a magnetic secure transmission (MST) antenna pattern and a near-field communication (NFC) antenna pattern.

Hereinafter, the present disclosure will be described in detail through embodiments, but the following embodiments and experiments are only examples of the present disclosure, and the scope of the present disclosure is not limited thereto.

[Embodiments 1 to 7] Preparation of Composite Substrate for Antenna Module

1. Preparation of Thermosetting Composition for Insulating Adhesion Layer

Components of the insulating adhesive epoxy composition were mixed according to a mixing ratio of Table 1 below, and methyl ethyl ketone (MEK) solvent was added to the obtained mixture in order to thereby prepare a dispersion of which the total concentration of the organic solid components and the inorganic solid components is 30 wt %. The unit of each component in Table 1 below is a percentage by weight.

2. Preparation of Composite Substrate

The prepared thermosetting resin composition (i.e., the dispersion) for an insulating adhesion layer was coated on matte-treated surfaces of the first copper foil and the second copper foil, respectively, by means of an applicator, and was dried at 160° C. for 5 minutes in a blower oven to have a thickness of 7 μm in order to thereby prepare a semi-cured adhesive epoxy composition.

A magnetic sheet (the magnetic filler content: 89 wt %) was interposed between the epoxy adhesive surfaces of the first copper foil and the second copper foil to then be thermo-compressed at 180° C. under a nip pressure of 50 kgf/cm$^2$ by a roll laminator, and to then be post-cured at 160° C. for 2 hours in order to thereby prepare composite substrates of the embodiments 1 to 6.

And a magnetic sheet was directly interposed between the first copper foil and the second copper foil to then be thermos-compressed under above conditions by a roll laminator, in order to thereby prepare composite substrate of the embodiment 7, without a use of an epoxy adhesive.

The properties of the composite substrates prepared above were measured according to the following measurement method, and the results thereof are shown in Table 1 below.

Thereafter, poor appearance (such as delamination and cracks of the composite substrate or a change in the color of the insulating layer) was observed. At this time, the case where the poor appearance (such as delamination or cracks) was observed is determined as "NG", and the case where the poor appearance (such as delamination or cracks) was not observed is determined as "Pass". In addition, the case where the peel strength amounts to 70% or more of the peel strength before the immersion was determined to have a good chemical resistance.

4) Flame Retardancy

All of the copper foils were removed from the composite substrate by etching the same in order to thereby make a sample. The flame retardancy of the sample was measured in accordance with UL94V-0 flame retardant standard. The sample that satisfied the UL94V-0 standard was evaluated as being "good" to then be represented by "o", whereas the sample that did not satisfy the UL94VTM-0 standard was evaluated as being "poor" to then be represented by "x".

TABLE 1

|  |  | Example 1 | Example 2 | Example 3 | Example 4 | Example 5 | Example 6 | Example 7 |
|---|---|---|---|---|---|---|---|---|
| Adhesive mixing ratio | Epoxy[1] | 100 | 100 | 100 | 100 | 100 | 100 | 0 |
|  | Thermoplastic resin[2] | 50 | 50 | 50 | 60 | 60 | 70 | 0 |
|  | Inorganic filler[3] | 10 | 15 | 20 | 15 | 20 | 15 | 0 |
|  | Curing agent[4] | 10 | 10 | 10 | 10 | 10 | 10 | 0 |
| Properties | Adhesion (Kgf/cm$^2$) | 1.2 | 1.3 | 1.4 | 1.5 | 1.4 | 1.4 | 0.7 |
|  | Heat resistance (@ 300° C.) | ○ | ○ | ○ | ○ | ○ | ○ | ○ |
|  | Flame retardancy (UL 94 V-0) | ○ | ○ | ○ | ○ | ○ | ○ | ○ |

(Annotation)
Epoxy resin[1]: Bisphenol A Type, Kuk-Do Chemical YD-011
Thermoplastic resin[2]: Carboxyl-terminated butadiene acrylonitrile rubber (CTBN), ZEON Corporation Nippol 1072
Inorganic filler[3]: Aluminum hydroxide, Showa Denko H42M
Curing agent[4]: 4,4'-diaminodiphenylsulfone

[Experiment 1] Evaluation of Composite Substrate for Antenna Module

Evaluation of the physical properties was performed by using the composite substrate prepared in Example 4 as follows, and the results thereof are shown in Table 1 above.

1) Peel Strength

In accordance with JIS C6471, a circuit having a pattern width of 1 mm was formed on the composite substrate, and then the minimum force was measured as a peel strength, which is required to peel a copper foil (the circuit) in the direction perpendicular to the surface of the laminated plate at a speed of 50 mm/min at 25° C.

2) Evaluation of Heat Resistance

In accordance with JIS C6471, a specimen was made by cutting the composite substrate side by 25 mm, and the specimen was put in a solder bath of 288° C. to float thereon for 10 seconds. Thereafter, poor appearance (such as delamination and cracks of the composite substrate or a change in the color of the insulating layer) was observed. At this time, the case where the poor appearance (such as delamination or cracks) was observed is evaluated as being "poor" to then be represented by "x", whereas the case where the poor appearance (such as delamination or cracks) was not observed is evaluated as being "good" to then be represented by "o".

3) Evaluation of Chemical Resistance

A composite substrate was immersed in HCl (10%) aqueous solution, NaOH (10%) aqueous solution, MEK, and IPA solvent for 10 minutes, respectively, and was evaluated.

TABLE 2

|  | unit |  |
|---|---|---|
| Total Thickness | μm | 145 |
| Magnetic Sheet Thickness | μm | 60 |
| Magnetic Permeability | — | 200 |
| Peel Strength | kgf/cm$^2$ | 1.50 |
| Heat Resistance (Solder floating) | 288° C., 10 sec | Pass |
| Chemical Resistance | 10% NaOH 10% HCl MEK IPA | Pass |

TABLE 3

|  | unit | Composite Substrate |
|---|---|---|
| Magnetic Sheet Thickness | μm | 60 |
| Magnetic permeability | Magnetic Permeability (u') | 200 |
|  | Magnetic Loss Factor (u") | <50 |

[Experiment 2] Evaluation of Magnetic Permeability of Composite Substrate for Antenna Module The magnetic permeability of the composite substrate for an antenna module was evaluated depending on the magnetic filler content.

In general, the magnetic permeability is measured by a coil inductance measuring method, a first-second coil coupling factor measuring method, an LCR meter measuring method, an antenna reflection coefficient measuring method, an impedance analyzer measuring method, or a network analyzer measuring method.

Among the above-mentioned magnetic permeability measuring methods, the coil inductance measuring method, the first-second coil coupling factor measuring method, and the LCR meter measuring method are intended for a relatively low frequency band, and the remaining three methods may be performed for up to a high frequency band. The measurement of the magnetic permeability is known to be very difficult to usually have an error of 5% to 50%. In the present disclosure, the magnetic permeability was measured in a frequency band of 3 MHz by using the expensive Impedance/Material Analyzer (E4991A) for more accurate measurement, and the results thereof are shown in Table 4 below.

As a result of the experiment, it was confirmed that the magnetic permeability of the composite substrate, according to the present disclosure, can be adjusted by changing the magnetic filler (magnetic powder) content. Accordingly, it can be seen that the composite substrate, according to the present disclosure, can be formed by means of a composite material according to a desired frequency band and then can replace the conventional ferrite sheet.

TABLE 4

|  | Example 8 | Example 9 | Example 10 | Example 4 | Example 11 |
|---|---|---|---|---|---|
| Magnetic Filler Content (wt %) | 80 | 83 | 86 | 89 | 92 |
| Magnetic Permeability | 100 | 150 | 180 | 200 | 230 |

What is claimed is:

1. A composite substrate for an antenna module, the composite substrate comprising:
    a first non-magnetic substrate configured to have a first copper foil;
    a second non-magnetic substrate configured to have a second copper foil; and
    a magnetic sheet configured to be interposed between the first non-magnetic substrate and the second non-magnetic substrate and configured to be integrally laminated with the non-magnetic substrates,
    wherein the composite substrate further comprises at least one of a first insulating adhesion layer and a second insulating adhesion layer, said first insulating adhesion layer being interposed between the first non-magnetic substrate and the magnetic sheet, and said second insulating adhesion layer being interposed between the second non-magnetic substrate and the magnetic sheet; and
    wherein a peel strength of the first insulating adhesion layer or the second insulating adhesion layer with respect to the magnetic sheet is 0.6 to 3.0 kgf/cm$^2$.

2. The composite substrate according to claim 1, wherein the composite substrate is configured to be integrated, through a roll-to-roll process, in the form of a roll that extends in the longitudinal direction.

3. The composite substrate according to claim 1, wherein the magnetic sheet is configured to include a magnetic powder and a polymer resin.

4. The composite substrate according to claim 3, wherein the magnetic powder is selected from the group consisting of a metal powder, a metal flake, and ferrite, which have magnetism.

5. The composite substrate according to claim 3, wherein the polymer resin is selected from the group consisting of non-halogen-based epoxy resin, silicone, urethane, polyimide, and polyamide.

6. The composite substrate according to claim 3, wherein the magnetic sheet includes a magnetic powder of 70 to 95 wt % based on the total weight of the magnetic sheet, and the magnetic permeability thereof is 50 to 250.

7. The composite substrate according to claim 1, wherein the composite substrate comprises:
    (i) the first copper foil, the first insulating adhesion layer, the magnetic sheet, the second insulating adhesion layer, and the second copper foil;
    (ii) the first copper foil, the first insulating adhesion layer, the magnetic sheet, and the second copper foil; or
    (iii) the first copper foil, the magnetic sheet, the second insulating adhesion layer, and the second copper foil, which are laminated in sequence.

8. The composite substrate according to claim 7, wherein the thickness of the magnetic sheet is in the range of 20 to 150 μm, the thicknesses of the first copper foil and the second copper foil are in the range of 6 to 105 μm, and the thicknesses of the first insulating adhesion layer and the second insulating adhesion layer are in the range of 1 to 30 μm.

9. The composite substrate according to claim 1, wherein the first insulating adhesion layer and second insulating adhesion layer are formed of a polymer resin selected from the group consisting of a polyimide and epoxy resin, respectively.

10. The composite substrate according to claim 9, wherein the first insulating adhesion layer and second insulating adhesion layer further comprise one or more selected from the group consisting of thermoplastic resin, inorganic fillers and curing agents, respectively.

11. The composite substrate according to claim 1, wherein the first and second non-magnetic substrates are flexible copper clad laminates (FCCL) or flexible printed circuit boards (FPCB), respectively.

12. The composite substrate according to claim 1, wherein the total thickness of the composite substrate is in the range of 34 to 420 μm.

13. The composite substrate according to claim 1, wherein the first copper foil and the second copper foil form a first antenna pattern portion and a second antenna pattern portion, respectively, which have a predetermined area, line width, and shape.

14. The composite substrate according to claim 13, wherein the composite substrate have one or more through-holes that pass through the first non-magnetic substrate, the magnetic sheet, and the second non-magnetic substrate, and the first antenna pattern portion and the second antenna pattern portion are connected to each other through the through-holes.

15. The composite substrate according to claim 13, further comprising at least one of a wireless charging (WPC)

antenna pattern, a magnetic secure transmission (MST) antenna pattern, and a near field communication (NFC) antenna pattern.

16. A method for preparing a composite substrate for an antenna module of claim 1, the method comprising:
(i) coating a thermosetting composition for a first insulating adhesion layer on one surface of a first copper foil and/or a thermosetting composition for a second insulating adhesion layer on one surface of a second copper foil, respectively, to then be dried; and
(ii) interposing a magnetic sheet between the first insulating adhesion layer of the first copper foil and the second insulating adhesion layer of the second copper foil, and laminating the same by applying roll lamination,
wherein the first insulating adhesion layer is interposed between the first non-magnetic substrate and the magnetic sheet; and the second insulating adhesion layer is interposed between the second non-magnetic substrate and the magnetic sheet, and
wherein a peel strength of the first insulating adhesion layer or the second insulating adhesion layer with respect to the magnetic sheet is 0.6 to 3.0 kgf/cm$^2$.

* * * * *